(12) United States Patent
Kim et al.

(10) Patent No.: US 9,240,541 B2
(45) Date of Patent: Jan. 19, 2016

(54) PIEZOELECTRIC VIBRATION MODULE AND VIBRATION GENERATING APPARATUS INCLUDING THE SAME

(71) Applicant: SAMSUNG ELECTRO-MECHANICS CO., LTD., Suwon (KR)

(72) Inventors: Boum Seock Kim, Suwon (KR); Jung Wook Seo, Suwon (KR)

(73) Assignee: Samsung Electro-Mechanics Co., Ltd., Suwon-si, Gyeonggi-do (KR)

( * ) Notice: Subject to any disclaimer, the term of this patent is extended or adjusted under 35 U.S.C. 154(b) by 367 days.

(21) Appl. No.: 13/959,682

(22) Filed: Aug. 5, 2013

(65) Prior Publication Data

US 2014/0346929 A1    Nov. 27, 2014

(30) Foreign Application Priority Data

May 27, 2013   (KR) .................. 10-2013-0059578

(51) Int. Cl.
   *H01L 41/09*   (2006.01)
   *B06B 1/06*    (2006.01)
   *B06B 1/14*    (2006.01)

(52) U.S. Cl.
   CPC .......... *H01L 41/0986* (2013.01); *B06B 1/0644* (2013.01); *B06B 1/14* (2013.01)

(58) Field of Classification Search
   CPC ...... B06B 1/0644; B06B 1/14; H01L 41/0986
   USPC ......... 310/329, 328, 324, 348, 338, 332, 330; 340/407.1, 407.2
   See application file for complete search history.

(56) References Cited

U.S. PATENT DOCUMENTS

| | | | |
|---|---|---|---|
| 8,963,401 B2* | 2/2015 | Smirnov .................. | 310/329 |
| 2007/0080951 A1 | 4/2007 | Maruyama | |
| 2014/0175847 A1* | 6/2014 | Schurg et al. ............ | 297/188.07 |
| 2015/0188455 A1* | 7/2015 | Oh et al. .................. | 310/329 |

FOREIGN PATENT DOCUMENTS

| | | |
|---|---|---|
| JP | 2000-78693 A | 3/2000 |
| KR | 10-2005-0038645 A | 4/2005 |
| KR | 10-2006-0000894 A | 1/2006 |

* cited by examiner

*Primary Examiner* — Thomas Dougherty
*Assistant Examiner* — Karen B Addison
(74) *Attorney, Agent, or Firm* — McDermott Will & Emery LLP

(57) ABSTRACT

There are provided a piezoelectric vibration module and a vibration generating apparatus including the same. The piezoelectric vibration module includes: a piezoelectric actuator including a piezoelectric element deformed in both a first direction and a second direction perpendicular to the first direction through the application of electrical power thereto; at least one first rod transferring deformation force of the piezoelectric actuator in the first direction; at least one second rod converting deformation force of the piezoelectric actuator in the second direction into deformation force in the first direction and transferring the converted deformation force; and a mass body connected to the first and second rods and disposed on the piezoelectric actuator so that displacement is generated in the first direction.

12 Claims, 6 Drawing Sheets

PIEZOELECTRIC VIBRATION MODULE AND VIBRATION GENERATING APPARATUS INCLUDING THE SAME

CROSS-REFERENCE TO RELATED APPLICATIONS

This application claims the priority of Korean Patent Application No. 10-2013-0059578 filed on 27 May, 2013, in the Korean Intellectual Property Office, the disclosure of which is incorporated herein by reference in its entirety.

BACKGROUND OF THE INVENTION

1. Field of the Invention

The present invention relates to a piezoelectric vibration module and a vibration generating apparatus including the same.

2. Description of the Related Art

A vibration generating apparatus, a component converting electrical energy into mechanical vibrations through the generation of electromagnetic force, is commonly mounted in a mobile phone to be used to silently notify a user of call reception by transferring vibrations thereto.

Meanwhile, in accordance with rapid growth in the mobile phone market and the trend for adding functionality to mobile phones, mobile phone components having a compact size and a high degree of quality have been required. In this situation, the demand for the development of a vibration generating apparatus having a novel structure capable of overcoming the disadvantages of existing vibration generating apparatuses, and having significantly improved quality with respect thereto, has increased.

In addition, as the release of smartphones has rapidly increased, a touchscreen scheme has been adopted therein, such that in addition to silently notifying a user of call reception, vibration generating apparatuses have been used in order to generate vibrations when the touchscreen is touched.

Degrees of performance required of the vibrations generated when the touchscreen is touched in particular, are as follows. First, since vibrations are generated more frequently in devices having touchscreens than in phones merely vibrating at the time of call reception, an operational lifespan of a vibration generating apparatus should be increased. Second, in order to improve user satisfaction when a user is provided with vibrations when the touchscreen is touched, a vibration response speed should be increased, in accordance with a speed at which the screen is touched.

In accordance to the demand for an increased operational lifespan and improved response times as described above, a linear vibrator has been currently used in the mobile phone including a touch screen.

The linear vibrator may linearly resonance-move a mover suspended from a spring due to electromagnetic force generated between a coil and a magnet using a mass body connected to an elastic member installed in the vibrator rather than using a principle of rotation of a motor to generate vibrations.

Alternatively, the linear vibrator may linearly resonance-move a mover through contraction and expansion of a piezoelectric element using the piezoelectric element as an actuator to generate vibrations.

Particularly, a vibration generating apparatus using the piezoelectric element is deformed when the piezoelectric element has power applied thereto. However, since a degree of deformation of the piezoelectric element is significantly low, it may be very difficult to utilize this deformation for vibrations.

SUMMARY OF THE INVENTION

An aspect of the present invention provides a piezoelectric vibration module using the principle that expansion and contraction of a piezoelectric element is generated in at least two directions, and a vibration generating apparatus including the same.

That is, in the case in which the piezoelectric element is expanded in one direction, contraction of the piezoelectric element is generated in a direction perpendicular to one direction. The piezoelectric element is slightly deformed through this contraction phenomenon to generate the same degree of force as the expansion effect in the one direction.

According to an aspect of the present invention, there is provided a piezoelectric vibration module including: a piezoelectric actuator including a piezoelectric element deformed in both a first direction and a second direction perpendicular to the first direction through the application of electrical power thereto; at least one first rod transferring deformation force of the piezoelectric actuator in the first direction; at least one second rod converting deformation force of the piezoelectric actuator in the second direction into deformation force in the first direction and transferring the converted deformation force; and a mass body connected to the first and second rods and disposed on the piezoelectric actuator so that displacement is generated in the first direction.

The piezoelectric element may have a columnar shape, the first rod may connect an upper surface of the piezoelectric actuator in the first direction and a lower surface of the mass body to each other, and the second rod may connect a surface of the piezoelectric actuator in the second direction and the mass body to each other.

The second rod may be disposed to be inclined with respect to the first direction.

The piezoelectric element may have a cylindrical shape or a polyprismatic shape.

The second rod may be an elastic wire.

At least two second rods may be provided, and the at least two second rods may be disposed with a predetermined interval therebetween in a circumferential direction of the piezoelectric actuator.

The second rods may be disposed to have a curvature.

The piezoelectric element may include a through-hole formed in a central portion thereof and penetrating therethrough in the first direction, and the second rod may connect an inner surface of the piezoelectric element in the second direction and the mass body to each other.

The piezoelectric element may have a doughnut shape.

At least two second rods may be provided, the at least two second rods may be disposed with a predetermined interval therebetween in a circumferential direction of the piezoelectric element, and the at least two second rods may include an intersecting point disposed in an intermediate portion therebetween.

The piezoelectric element may include a groove formed in a central portion thereof and opened upwardly in the first direction, and the second rod may connect an inner surface of the piezoelectric element in the second direction and the mass body to each other.

According to another aspect of the present invention, there is provided a vibration generating apparatus including: a housing having an internal space; a piezoelectric actuator mounted in the housing so as to be disposed in the internal space and including a piezoelectric element deformed in both a first direction and a second direction perpendicular to the first direction through the application of electrical power thereto; at least one first rod transferring deformation force of the piezoelectric actuator in the first direction; at least one second rod converting deformation force of the piezoelectric actuator in the second direction into deformation force in the first direction and transferring the converted deformation force; and a mass body connected to the first and second rods and disposed on the piezoelectric actuator so that displacement is generated in the first direction.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Figure 1:
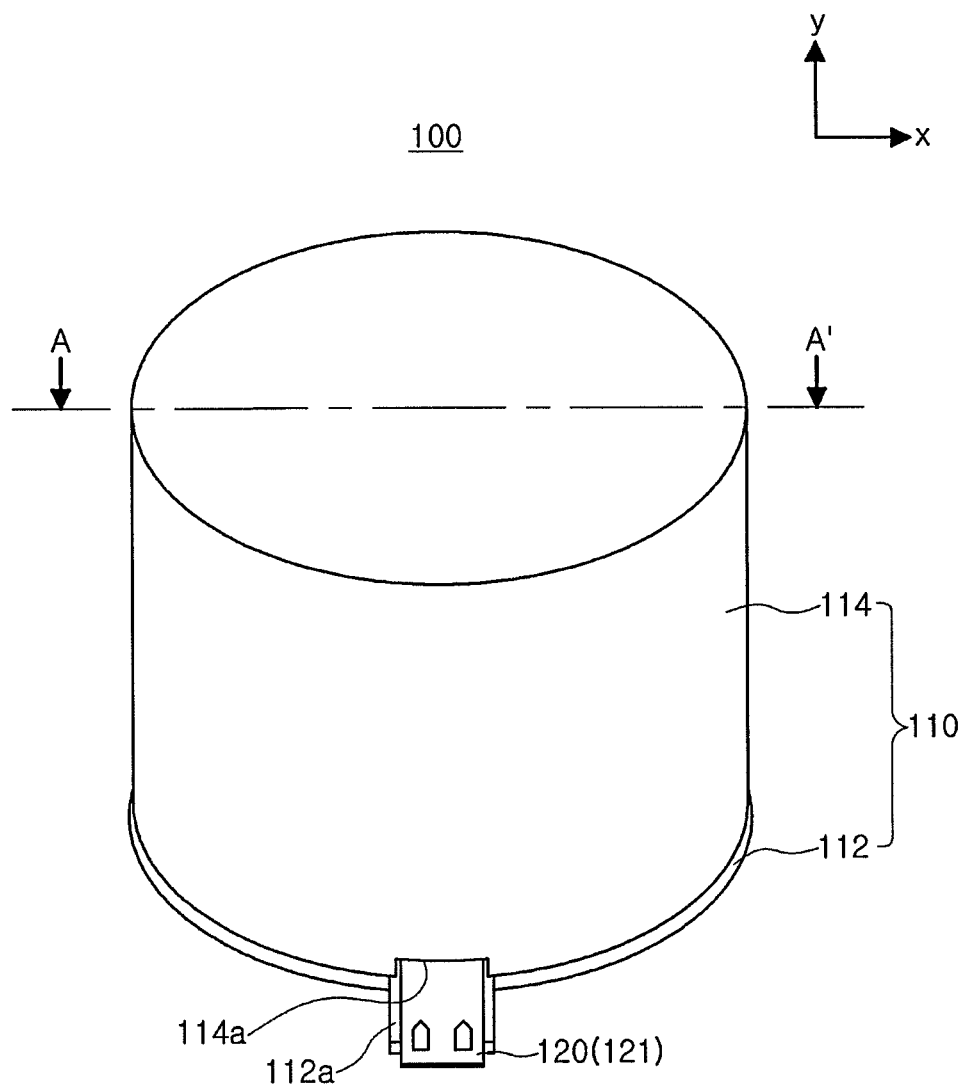
FIG. 1 is an assembled perspective view of a vibration generating apparatus according to an embodiment of the present invention.

Hereinafter, embodiments of the present invention will be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity, and the same reference numerals will be used throughout to designate the same or like elements.

Further, like reference numerals will be used to designate like components having similar functions throughout the drawings within the scope of the present invention.

Figure 2:
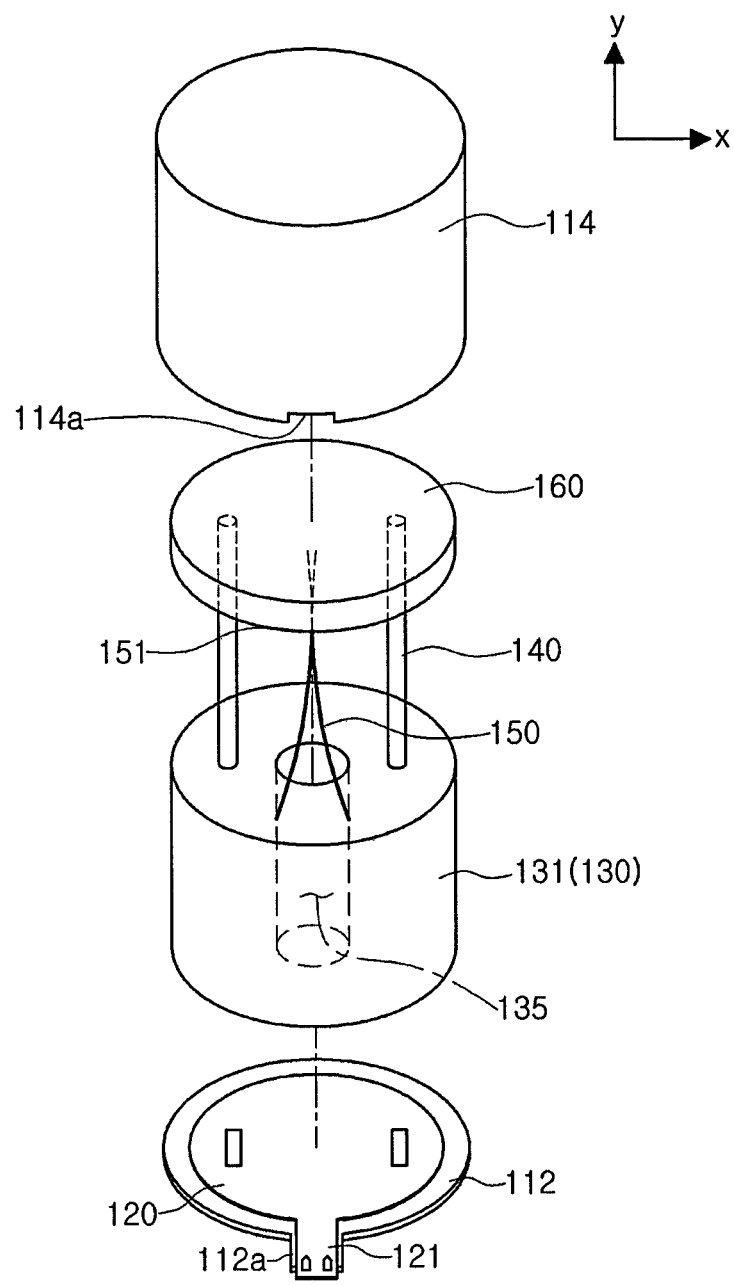
FIG. 2 is an exploded perspective view of the vibration generating apparatus according to the embodiment of the present invention.

FIG. 1 is an assembled perspective view of a vibration generating apparatus according to an embodiment of the present invention; FIG. 2 is an exploded perspective view of the vibration generating apparatus according to the embodiment of the present invention; and FIG. 3 is a cross-sectional view taken along line A-A' of FIG. 1.

Figure 3:
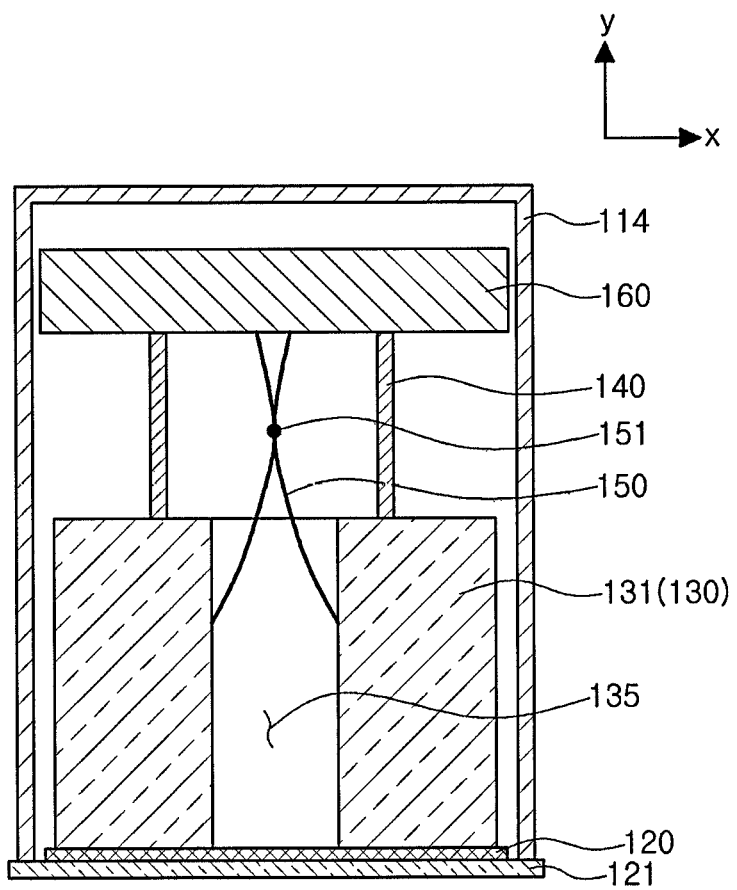
FIG. 3 is a cross-sectional view taken along line A-A' of FIG. 1.

Referring to FIGS. 1 to 3, the vibration generating apparatus 100 according to the embodiment of the present invention may include a housing 110 forming an appearance of the vibration generating apparatus 100, a board 120 supplying power, a piezoelectric actuator 130 including a piezoelectric element 131 contracted and expanded in a first direction (a 'y' direction in the accompanying drawings) and a second direction (an 'x' direction in the accompanying drawings) by the supply of the power, at least one first rod 140 transferring deformation force of the piezoelectric actuator 130 in the first direction, at least one second rod 150 converting deformation force of the piezoelectric actuator 130 in the second direction into deformation force in the first direction and transferring the converted deformation force, and a mass body 160 connected to the first and second rods 140 and 150 and disposed on the piezoelectric actuator 130 so that displacement is generated in the first direction.

Terms with respect to directions will first be defined. As viewed in FIG. 1, the second direction refers to a horizontal direction, that is, a direction from one side of the piezoelectric actuator 130 or the mass body 160 toward the other side thereof (that is, a width direction), the 'x' direction, and the first direction refers to a vertical direction, that is, a direction from a lower surface of the piezoelectric actuator 130 or the mass body 160 toward an upper surface thereof (that is, a thickness direction), the 'y' direction. However, the second direction does not refer to any specific direction, but may refer to any direction perpendicular to the first direction.

In addition, a main surface refers to the widest surface in a predetermined member, for example, the piezoelectric actuator 130 or the mass body 160.

Further, an outer side (or an outer portion) of the predetermined member refers to the left or the right direction based on the approximate center of the piezoelectric actuator 130 or the mass body 160 in the horizontal direction, and an inner side (or an inner portion) of the predetermined member refers to the approximate center side of the piezoelectric actuator 130 and the mass body 160 in the vertical direction.

The housing 110 may have an internal space and form the outer casing of the vibration generating apparatus 100. The housing 110 may include a bracket 112 and a case 114. The bracket 112 may be mounted with a piezoelectric actuator 130 to be described below. Alternatively, after the board 120 is mounted on the bracket 112, the piezoelectric actuator 130 may be mounted on the board 120. In addition, the case 114 may cover the bracket 112 and be coupled to the bracket 112 to provide the internal space.

Here, although the form in which the board 120 or the piezoelectric actuator 130 is mounted on the bracket 112 has been shown in the embodiment of the present invention, the board 120 and the piezoelectric actuator 130 may also be fixedly mounted to the case 114.

The case 114 may have a box shape, for example, a cylindrical shape or a polyprismatic shape, in which a lower surface thereof is opened so as to entirely cover the bracket 112.

The bracket 112 or the case 113 is not limited to the above-mentioned shape, but may have various shapes. For example, the bracket may be provided as a circular plate, and the case may have a cylindrical shape in which it covers the circular plate to provide an internal space.

The bracket 112 may have the board 120 fixedly mounted thereon. The board 120 may be mounted on an inner surface of the housing 110 so as to be positioned in the internal space of the housing 110 or be mounted on an outer surface of the housing 110. The board 120 may be a (flexible) printed circuit board. Hereinafter, the case in which the board 120 is mounted on the inner surface of the housing 110, more specifically, the bracket 112 will be described by way of example.

In addition, in the case in which the board 120 is mounted on the inner surface of the housing 110, the board 120 may include a terminal connecting part 121 exposed to the outside of the housing 110.

Therefore, the housing 110 may be provided with a through-hole 114a so that the terminal connecting part 121 is exposed to the outside. Particularly, the through-hole 114a may be formed in the case 114. In addition, the bracket 112 may be provided with a terminal supporting part 112a protruding outwardly at a position corresponding to that of the through-hole 144a, and the terminal connecting part 121 may be extended on an upper surface of the terminal supporting part 112a.

Meanwhile, although not shown, the housing 110 may be mounted with a stopper or a damper. More specifically, the housing 110 may include the stopper or the damper mounted in the internal space thereof in order to limit displacement of the mass body 160 or absorb vibrations. The stopper or the damper may be continuously or discontinuously mounted on the bracket 112 or in the case 114 in an edge direction of the mass body 160.

In addition, since the bracket 112 may be provided with the terminal supporting part 112a, in the case in which the stopper is provided on the bracket 112, a portion at which the terminal supporting part 112a is provided may be omitted. This is due to the fact that the terminal connecting part 121 is extended on the upper surface of the terminal supporting part 112a.

The board 120 may have the piezoelectric actuator 130 mounted on an upper surface thereof. That is, the piezoelectric actuator 130 may be mounted so as to be positioned in the internal space of the housing 110. The piezoelectric actuator 130 may have a cylindrical shape or a polyprismatic shape.

The piezoelectric actuator 130 may include an electrode and the piezoelectric element 131. Power is applied to the electrode, such that the piezoelectric element 131 may be repeatedly expanded and contracted in the first and second directions. In the case in which the piezoelectric element 131 is expanded in the first direction, it may be contracted in the second direction, and in the case in which the piezoelectric element 131 is contracted in the first direction, it may be expanded in the second direction.

Figure 5:
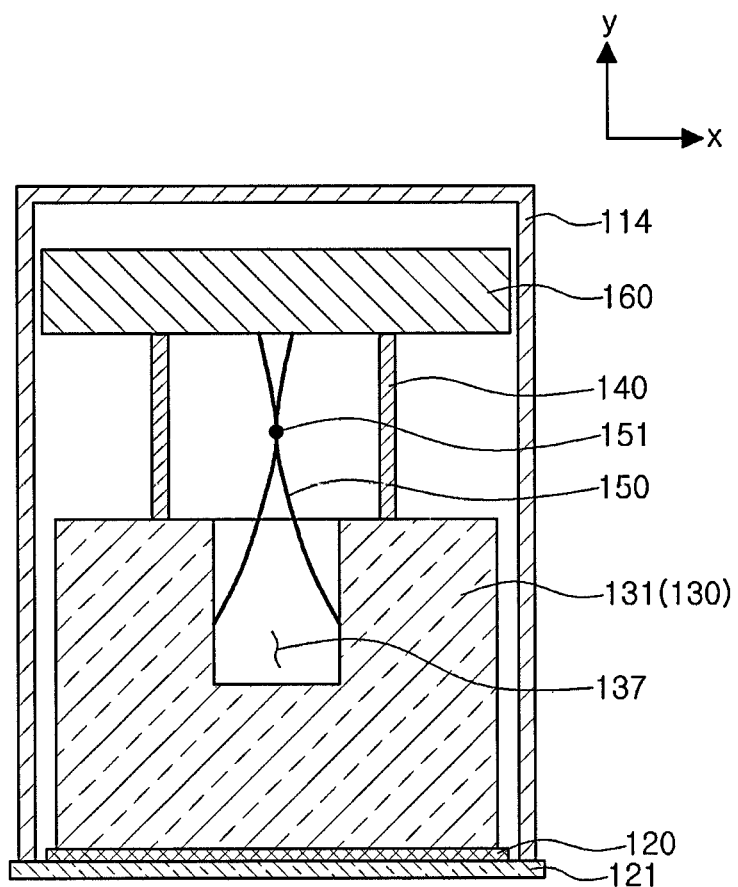
FIG. 5 is a cross-sectional view taken along line A-A' of FIG. 1 according to another embodiment of the present invention.

In addition, the piezoelectric element 131 may include a groove 137 (See FIG. 5) formed in the first direction in a central portion thereof. Preferably, the piezoelectric element 131 may include a through-hole 135 formed in the central portion thereof and penetrating therethrough in the first direction. That is, the piezoelectric element 131 may include the groove 137 opened upwardly in the first direction or the through-hole 135 entirely penetrating therethrough in the first direction. Here, the groove 137 may have a shape in which a lower end of the through-hole 135 is partially closed. Next, an example in which the through-hole 135 is included in the piezoelectric element 131 will be mainly described with reference to the accompanying drawings. However, a member applied to or mounted in the through-hole 135 may also be similarly applied to the groove 137.

In this case, when the piezoelectric element 131 is expanded in the first direction, a diameter of the through-hole 135 or the groove 137 may decrease, and when the piezoelectric element 131 is contracted in the first direction, a diameter of the through-hole 135 or the groove 137 may increase.

The piezoelectric element 131 may be formed of a piezoelectric material, preferably, a lead zirconate titanate (PZT) ceramic material, or the like. However, the present invention is not limited thereto. In addition, the piezoelectric element 131 may have a cylindrical shape, a polyprismatic shape, or a doughnut shape.

The piezoelectric actuator 130 may be mounted with at least one first rod 140 transferring the deformation force of the piezoelectric actuator 130 in the first direction, at least one second rod 150 converting the deformation force of the piezoelectric actuator 130 in the second direction into the deformation force in the first direction and transferring the converted deformation force. The first and second rods 140 and 150 may include a mass body 160, that is, a weight, to be described below mounted thereon. The first and second rods 140 and 150 may generate vertical displacement of the mass body 160 mounted thereon depending on the expansion or the contraction of the piezoelectric actuator 130 in the first and second directions.

Here, in the case in which the piezoelectric actuator 130 is expanded in the first direction, the mass body 160 may receive force transferred by the first rod 140 to move upwardly in the first direction. Therefore, in the case in which the piezoelectric actuator 130 is expanded in the first direction, force transferred by the second rod 150 should be capable of moving the mass body 160 upwardly in the first direction.

In addition, in the embodiment of the present invention, the piezoelectric element 131 may include the groove 137 or the through-hole 135 formed in the first direction at a central portion thereof. That is, the piezoelectric element 131 may include the groove 137 opened upwardly in the first direction or the through-hole 135 entirely penetrating therethrough in the first direction. In this case, when the piezoelectric element 131 is expanded in the first direction, a diameter of the through-hole 135 or the groove 137 may decrease, and when the piezoelectric element 131 is contracted in the first direction, a diameter of the through-hole 135 or the groove 137 may increase.

Therefore, when the second rod 150 has an end portion connected to an inner surface of the piezoelectric element 131, that is, an inner wall surface forming the through-hole 135 or the groove 137 and is disposed to be inclined with respect to the first direction, force may be transferred to the mass body 160 so as to correspond to a direction in which the piezoelectric element is expanded.

That is, when the piezoelectric element 131 is expanded in the first direction, the first rod 140 may apply force to the mass body 160 so that the mass body 160 moves upwardly in the first direction and the second rod 150 may apply force pushing the mass body 160 upwardly in the first direction to the mass body 160 due to a decrease in the diameter of the through-hole 135 or the groove 137. Therefore, directions of the forces coincide with each other, such that the sum of forces applied to the mass body 160 may increase. In addition, when the piezoelectric element 131 is contracted in the first direction, the sum of forces may increase in a direction opposite to the above-mentioned direction. That is, both of the deformations of the piezoelectric element in two directions are used for vibrations of the mass body, whereby vibrational efficiency of the piezoelectric vibration module may significantly increase.

Meanwhile, it is sufficient for the first rod 140 to connect an upper surface of the piezoelectric actuator 130 in the first direction and a lower surface of the mass body 160 to each other, which may be accomplished in various schemes. For example, any unit capable of transferring force, such as an elastic wire, an elastic bar, a rigid bar, a rigid wire, or the like, may be used.

In addition, the second rod 150 may connect a surface of the piezoelectric actuator 130 in the second direction and the mass body 160 to each other. However, even in the case in which the second rod 150 is disposed to be inclined with respect to the first direction, such that the piezoelectric actuator 130 is deformed in the second direction perpendicular to the first direction, the second rod 150 may transfer force in the first direction. In addition, in the case in which a rod having low degree of elastic force is used as the first rod 140, a wire, a bar, or the like, having elastic force may be used as the second rod 150 so as to be easily utilized.

Further, the number of second rods 150 may be at least two, and the second rods 150 may be disposed with a predetermined interval therebetween in a circumferential direction of the piezoelectric actuator 130 to uniformly transfer the force to the mass body 160.

In addition, at least two second rods 150 may be disposed to have a curvature and include an intersecting point 151 disposed in an intermediate portion therebetween. The intersecting point 151 may be a portion connecting the second rods 150 to each other to fix the second rods 150. In this case, since transfer of the force by the second rods 150 may significantly increase as shown in FIG. 2, efficiency may be very high.

The first and second rods 140 and 150 may include the mass body 160 disposed thereon. The mass body 160 may be a weight having a high specific gravity. For example, the mass body 160 may be formed of a copper-based material such as brass, or the like, or a tungsten-based material.

The mass body 160 may have a shape corresponding to that of the piezoelectric element 131. That is, the mass body 160 may have a cylindrical shape or a polyprismatic shape.

Figure 4A:
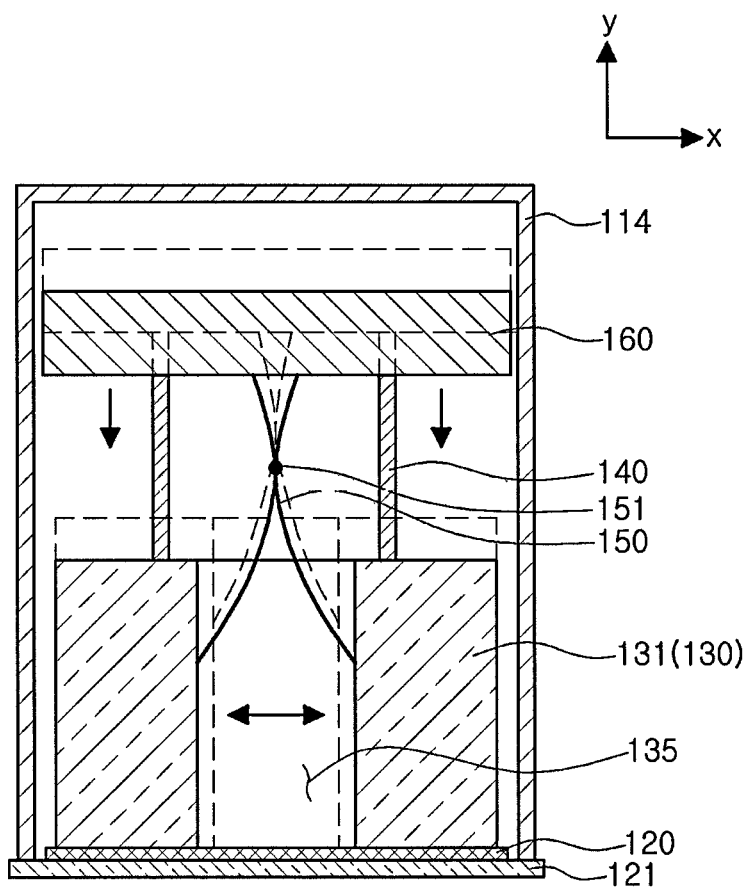
FIGS. 4A and 4B are illustrative diagrams showing an operation of the vibration generating apparatus according to the embodiment of the present invention.
Figure 4B:
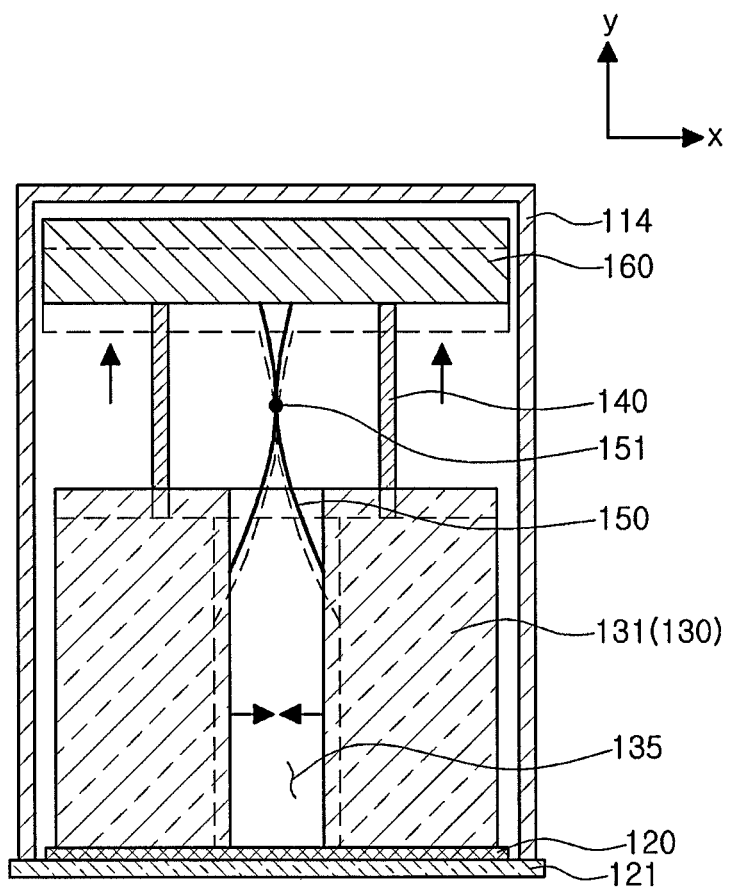

FIGS. 4A and 4B are illustrative diagrams showing an operation of the vibration generating apparatus according to the embodiment of the present invention. FIG. 4A shows a form in which the piezoelectric element 130 is expanded in the first direction, and FIG. 4B shows a form in which the piezoelectric actuator 130 is contracted in the first direction.

Referring to FIG. 4A, when the piezoelectric element 131 is expanded in the first direction, the first rod 140 may apply force to the mass body 160 so that the mass body 160 moves upwardly in the first direction and the second rod 150 may apply force pushing the mass body 160 upwardly in the first direction to the mass body 160 due to a decrease in the diameter of the through-hole 135 or the groove 137. Therefore, directions of force coincide with each other, such that the sum of forces applied to the mass body 160 may increase. That is, the piezoelectric element 131 is deformed, such that vibrations may be more easily generated upwardly in the first direction in the mass body 160 (See FIG. 4A in which a form before deformation is represented by a dotted line and a form after deformation is represented by a solid line).

In addition, referring to FIG. 4B, when the piezoelectric element 131 is contracted in the first direction, the first rod 140 may apply force to the mass body 160 so that the mass body 160 moves downwardly in the first direction and the second rod 150 may apply force pulling the mass body 160 downwardly in the first direction to the mass body 160 due to an increase in the diameter of the through-hole 135 or the groove 137. Therefore, directions of the forces coincide with each other, such that the sum of forces applied to the mass body 160 may increase. That is, the piezoelectric element 131 is deformed, such that vibrations may be more easily generated downwardly in the first direction in the mass body 160 (See FIG. 4B in which a form before deformation is represented by a dotted line and a form after deformation is represented by a solid line).

That is, both of the deformations of the piezoelectric element 131 in two directions are used for vibrations of the mass body, whereby vibrational efficiency of the piezoelectric vibration module may significantly increase.

As set forth above, according to the embodiments of the present invention, the piezoelectric vibration module using the fact that an expansion and contraction phenomenon of a piezoelectric element is generated in at least two directions, and the vibration generating apparatus including the same may be provided.

In other words, in the case in which the piezoelectric element is expanded in one direction, contraction of the piezoelectric element is generated in a direction perpendicular to one direction. The piezoelectric element may be slightly deformed through this contraction phenomenon to generate the same force as the expansion effect in one direction.

While the present invention has been shown and described in connection with the embodiments, it will be apparent to those skilled in the art that modifications and variations can be made without departing from the spirit and scope of the invention as defined by the appended claims.

What is claimed is:

1. A piezoelectric vibration module comprising:
   a piezoelectric actuator including a piezoelectric element deformed in both a first direction and a second direction perpendicular to the first direction through the application of electrical power thereto;
   at least one first rod transferring deformation force of the piezoelectric actuator in the first direction;
   at least one second rod converting deformation force of the piezoelectric actuator in the second direction into deformation force in the first direction and transferring the converted deformation force; and
   a mass body connected to the first and second rods and disposed on the piezoelectric actuator so that displacement is generated in the first direction.

2. The piezoelectric vibration module of claim 1, wherein the piezoelectric element has a columnar shape,
   the first rod connects an upper surface of the piezoelectric actuator in the first direction and a lower surface of the mass body to each other, and
   the second rod connects a surface of the piezoelectric actuator in the second direction and the mass body to each other.

3. The piezoelectric vibration module of claim 2, wherein the second rod is disposed to be inclined with respect to the first direction.

4. The piezoelectric vibration module of claim 2, wherein the piezoelectric element has a cylindrical shape or a polyprismatic shape.

5. The piezoelectric vibration module of claim 2, wherein the second rod is an elastic wire.

6. The piezoelectric vibration module of claim 2, wherein at least two second rods are provided, and
   the at least two second rods are disposed with a predetermined interval therebetween in a circumferential direction of the piezoelectric actuator.

7. The piezoelectric vibration module of claim 2, wherein the second rods are disposed to have a curvature.

8. The piezoelectric vibration module of claim 2, wherein the piezoelectric element includes a groove formed in a central portion thereof and opened upwardly in the first direction, and
   the second rod connects an inner surface of the piezoelectric element in the second direction and the mass body to each other.

9. The piezoelectric vibration module of claim 2, wherein the piezoelectric element includes a through-hole formed in a central portion thereof and penetrating therethrough in the first direction, and
   the second rod connects an inner surface of the piezoelectric element in the second direction and the mass body to each other.

10. The piezoelectric vibration module of claim 9, wherein the piezoelectric element has a doughnut shape.

11. The piezoelectric vibration module of claim 9, wherein at least two second rods are provided,
   the at least two second rods are disposed with a predetermined interval therebetween in a circumferential direction of the piezoelectric element, and the at least two second rods include an intersecting point disposed in an intermediate portion therebetween.

12. A vibration generating apparatus comprising:

a housing having an internal space;

a piezoelectric actuator mounted in the housing so as to be disposed in the internal space and including a piezoelectric element deformed in both a first direction and a second direction perpendicular to the first direction through the application of electrical power thereto;

at least one first rod transferring deformation force of the piezoelectric actuator in the first direction;

at least one second rod converting deformation force of the piezoelectric actuator in the second direction into deformation force in the first direction and transferring the converted deformation force; and a mass body connected to the first and second rods and disposed on the piezoelectric actuator so that displacement is generated in the first direction.

* * * * *